United States Patent [19]
Krause

[11] Patent Number: 5,514,875
[45] Date of Patent: May 7, 1996

[54] LINEAR BIDIRECTIONAL OPTOCOUPLER

[75] Inventor: Robert Krause, Menlo Park, Calif.

[73] Assignee: Siemens Components, Inc., Cupertino, Calif.

[21] Appl. No.: 514,133

[22] Filed: Aug. 11, 1995

Related U.S. Application Data

[63] Continuation of Ser. No. 129,640, Sep. 30, 1993, abandoned.

[51] Int. Cl.⁶ .......................... G02B 27/00; H04B 10/00
[52] U.S. Cl. ...................... 250/551; 250/226; 359/163
[58] Field of Search ............................ 250/551, 226; 359/114, 123, 124, 133, 152, 162, 163

[56] References Cited

U.S. PATENT DOCUMENTS

| | | | |
|---|---|---|---|
| 3,413,480 | 11/1968 | Biard et al. | 250/551 |
| 3,524,486 | 8/1970 | Harnden, Jr. | 250/551 |
| 3,818,451 | 6/1974 | Coleman | 250/551 |
| 4,228,323 | 10/1980 | Feiner et al. | 250/551 |
| 4,228,349 | 10/1980 | Ettenberg et al. | 250/226 |
| 4,711,997 | 12/1987 | Miller | 250/551 |
| 4,972,089 | 11/1990 | Stevenson | 250/551 |
| 5,051,601 | 9/1991 | Atobe et al. | 250/551 |
| 5,140,152 | 8/1992 | Van Zeghbroeck | 250/214 |

FOREIGN PATENT DOCUMENTS

| | | |
|---|---|---|
| 0084621 | 8/1982 | European Pat. Off. . |
| 0174073 | 3/1986 | European Pat. Off. . |
| 57-067907 | 4/1982 | Japan . |
| 63-079384 | 4/1988 | Japan . |
| 856007 | 8/1981 | U.S.S.R. ................ 250/551 |

OTHER PUBLICATIONS

Tyrrell, "Quad Cut–Out", New Electronics, vol. 12, No. 20, (16 Oct. 1979), p. 86.

Primary Examiner—Stephone Allen
Attorney, Agent, or Firm—Joseph S. Codispoti

[57] ABSTRACT

Bidirectional isolated interfaces using optical couplers offer a compact and cost-effective alternative to traditional line transformers. The devices can be configured to provide half-duplex or full-duplex communication.

4 Claims, 2 Drawing Sheets

LINEAR BIDIRECTIONAL OPTOCOUPLER

CROSS-REFERENCE TO RELATED APPLICATION

This is a continuation of Ser. No. 08/129,640 filed Sep. 30, 1993 now abandoned.

FIELD OF THE INVENTION

This invention generally relates to telephone line communications. Specifically, the invention is directed to coupling devices for telephone subscriber lines.

The invention is related to the bidirectional coupler of the type described in copending U.S. patent application entitled "Monolithic Optical Emitter-Detector" by Robert Krause, the applicant herein, filed Sep. 30, 1993 as U.S. patent application Ser. No. 08/129,814. The foregoing application is assigned to the same assignee as the present patent application and the details of it are incorporated herein by reference.

BACKGROUND OF THE INVENTION

Currently, modems employ audio/data transformers for coupling their circuitry to telephone lines. Such a transformer is often large and costly. In some applications, such as the currently-popular notebook computers, a bulky line transformer is highly undesirable. However, a line transformer affords large bandwidth performance which is necessary for modem operation.

It is therefore desirable to provide an alternative to the traditional line transformer without sacrificing frequency performance. Ideally, such a device would be smaller and less expensive to manufacture.

SUMMARY OF THE INVENTION

The aforementioned problems are obviated by the present invention which provides a bidirectional optical coupler. In the devices described herein, two individually-controllable emitting sources are contained in a single device. One embodiment of the invention is a linear bidirectional half-duplex optocoupler. It has two emitters and two photodetectors in a single optical cavity.

Another embodiment is a linear bidirectional full-duplex optocoupler that offers full-duplex communication. By using optical wavelength division multiplexing, simultaneous communications can be conducted in one optical cavity. Here, one emitter-detector pair communicates on one wavelength while another emitter-detector pair communicates on a second wavelength.

In another variation, full-duplex communication is achieved by using frequency division multiplex techniques. The emitters generate optical radiation on the same wavelength, but the data is kept separate in frequency.

BRIEF DESCRIPTION OF THE DRAWINGS

A more complete understanding of the present invention, as well as other objects and advantages thereof not enumerated herein, will become apparent upon consideration of the following detailed description and the accompanying drawings, wherein.

DETAILED DESCRIPTION

The devices described here are based in part on the technology used in the Siemens® IL300 family of aluminum gallium arsenide (AlGaAs) linear optocouplers, discussed in the Siemens Optoelectronics Data Book 1993, pp. 5–115 through 5–122, and pp. 11–177 through 11–193. It should be understood that other devices can be used. Also, the couplers could be used with other types of electromagnetic radiation, such as ultraviolet light.

Figure 1:
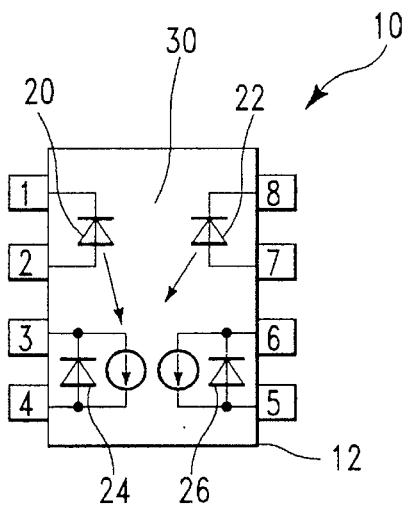
FIG. 1 is a schematic diagram of a linear bidirectional half-duplex optocoupler constructed in accordance with the present invention.

A linear bidirectional half-duplex optocoupler 10 constructed in accordance with the present invention is shown in the schematic diagram of FIG. 1. It is contained in a dual in-line package (DIP) 12 having eight pins, but any suitable packaging arrangement or device can be used. The optocoupler 10 comprises four devices: a first emitter 20, a second emitter 22, a first photodetector 24, and a second photodetector 26. For ease of understanding how the photodetectors 24, 26 operate in the devices discussed here, they are drawn as a combination diode and current source, with the direction of current flow indicated. This convention is followed throughout this description.

The first emitter 20 is connected across DIP pins 1 and 2, the second emitter 22 is connected across DIP pins 7 and 8, the first photodetector 24 is connected across DIP pins 3 and 4, and the second photodetector 26 is connected across DIP pins 5 and 6. The optical radiation from the first and second emitters 20 and 22 pass through a common optical cavity 30. The optical cavity may be any suitable light conducting medium.

Figure 2:
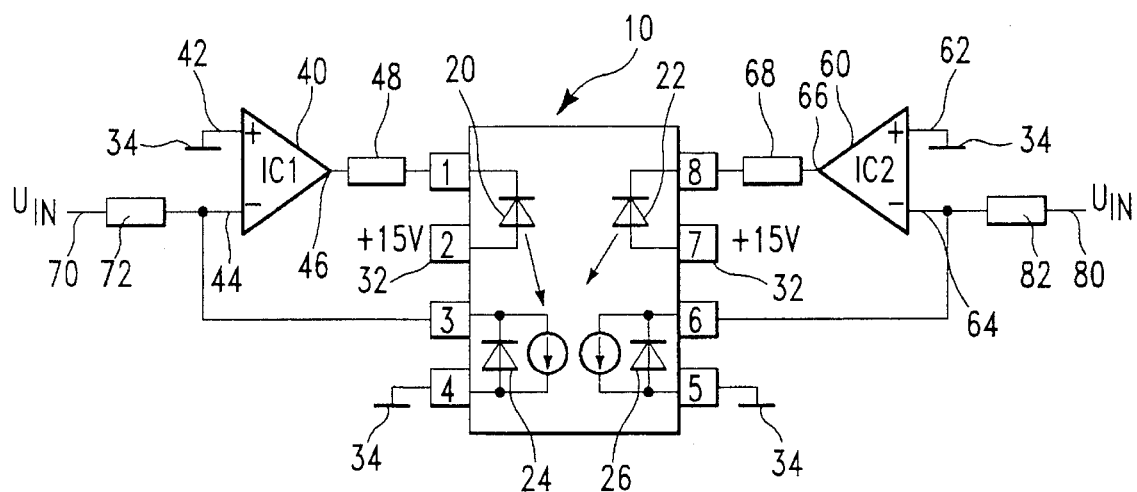
FIG. 2 is a schematic diagram of an application incorporating the linear bidirectional half-duplex optocoupler of FIG. 1.

A circuit incorporating the linear bidirectional half-duplex optocoupler 10 is shown in FIG. 2. To simplify the presentation, only the transmission part of the circuit is shown; it should be understood that there would be additional components for the receiving function. In this circuit, supply voltage 32 is connected to DIP pins 2 and 7, to provide forward bias to the first and second emitters 20, 22, and DIP pins 4 and 5 are connected to ground 34.

A first differential amplifier IC1 40, having a noninverting input 42, an inverting input 44, and an output 46, is connected from its output 46 through a load resistor 48 to DIP pin 1 of the coupler 10. Similarly, a second differential amplifier IC2 60, having a noninverting input 62, an inverting input 64, and an output 66, is connected from its output 66 through a load resistor 68 to DIP pin 8 of the coupler 10. The noninverting inputs 42, 62 of the respective amplifiers IC1 and IC2 40, 60 are connected to ground 34. Also, the photodetectors 24, 26 are connected at DIP pins 3 and 6 to the inverting inputs 44, 64 of the respective differential amplifiers 40, 60.

A first signal input 70 is coupled through a coupling resistor 72 to the inverting input 44 of the first differential amplifier IC1 40. Similarly, a second signal input 80 is coupled through a coupling resistor 82 to the inverting input 64 of the second differential amplifier IC2 60.

The path from the first photodetector 24 (pin 3) to the inverting input 44 of the first differential amplifier 40 completes a servo loop for the first emitter 20. In addition to having the optical radiation impinge on the second photodetector 26 for transmission of the first input signal 70, some of the optical radiation is also received by the first photodetector 24 and the resultant output is fed back to the first differential amplifier 40. Servo loops, also employed in the circuits described below, are discussed in greater detail in the Siemens Optoelectronics Data Book 1993.

Figure 3:
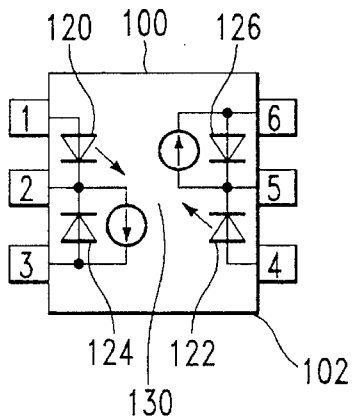
FIG. 3 is a schematic diagram of another embodiment of a linear bidirectional half-duplex optocoupler constructed in accordance with the present invention.

Another embodiment of a linear bidirectional half-duplex optocoupler constructed in accordance with the present invention is illustrated in FIG. 3. The half-duplex optocoupler 100 shown is contained in a six-pin dual in-line package (DIP) 102. Like the optocoupler 10 of FIG. 1, this optocoupler 100 also comprises four devices: a first emitter 120, a second emitter 122, a first photodetector 124, and a second photodetector 126. Here, adjacent devices share a DIP pin.

The first emitter 120 is connected across DIP pins 1 and 2; the second emitter 122 is connected across DIP pins 4 and 5; the first photodetector 124 is connected across DIP pins 2 and 3; and the second photodetector 126 is connected across DIP pins 5 and 6. The optical radiation from the first and second emitters 120 and 122 pass through a common optical cavity 130. The optical cavity 130 may be any suitable light conducting medium.

Figure 4:
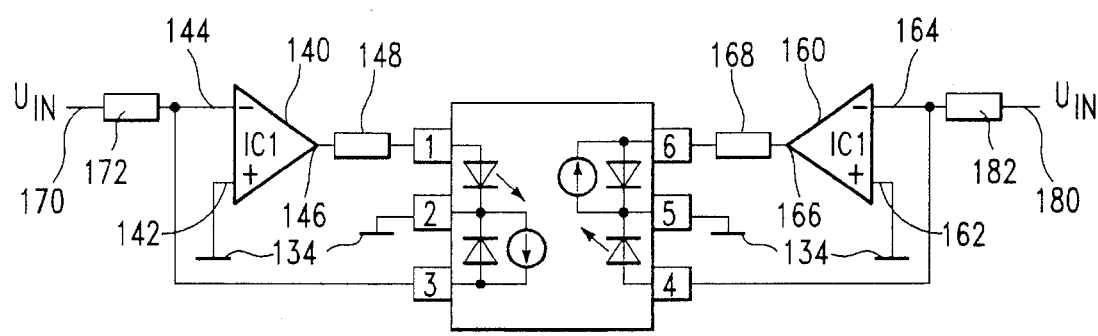
FIG. 4 is a schematic diagram of an application incorporating the linear bidirectional half-duplex optocoupler of FIG. 3.

A circuit incorporating the linear bidirectional half-duplex optocoupler 100 of FIG. 3 is shown in FIG. 4. Again, to simplify the presentation, only the transmission part of the circuit is shown. In this circuit, DIP pins 2 and 5 are connected to ground 134.

A first differential amplifier IC1 140, having a noninverting input 142, an inverting input 144, and an output 146, is connected from its output 146 through a load resistor 148 to DIP pin 1 of the coupler 100. Similarly, a second differential amplifier IC2 160, having a noninverting input 162, an inverting input 164, and an output 166, is connected from its output 166 through a load resistor 168 to DIP pin 4 of the coupler 100. The noninverting inputs 142, 162 of the respective amplifiers IC1 and IC2 140, 160 are connected to ground 134. Also, the photodetectors 124,126 are connected at DIP pins 3 and 6 to the inverting inputs 144, 164 of the respective differential amplifiers 140, 160.

A first signal input 170 is coupled through a coupling resistor 172 to the inverting input 144 of the first differential amplifier 140. Similarly, a second signal input 180 is coupled through a coupling resistor 182 to the inverting input 164 of the second differential amplifier 160.

Note that by using a combined emitter and detector in the half-duplex optocoupler 100 of FIG. 3 in place of the first and second emitters 120, 122 and the first and second photodetectors 124, 126, the required assembly procedure and overall cost can be reduced.

A full-duplex optocoupler, offering an effective higher data transfer rate, can be provided using some of the principles of the half-duplex optocouplers described above. Simultaneous communications afforded by a full-duplex design are possible if the optical radiations used in the optocoupler are at different wavelengths. This can be achieved using optical wavelength division multiplexing.

With optical wavelength division multiplexing, although two different wavelengths of light are simultaneously present in the same optical cavity, they do not interfere with one another at their respective detectors because the photodetectors function as wavelength-selective filters. By using an LED emitter as a detector, better discrimination is possible since the LED sensitivity closely follows its emission spectrum. For example, one can achieve an optical separation of ≧20 dB using green LEDs, generating light at 560 nm, with 940 nm infrared radiation in the same optical cavity.

Figure 5:
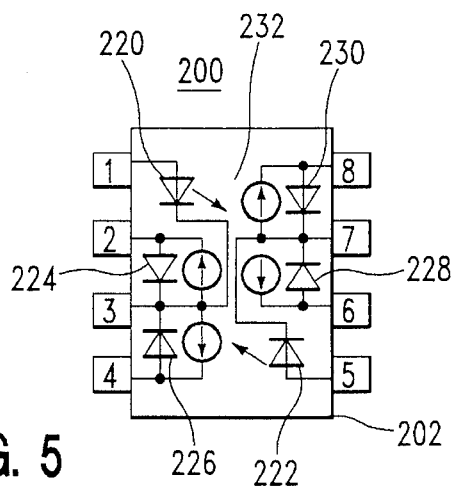
FIG. 5 is a schematic diagram of a linear bidirectional full-duplex optocoupler constructed in accordance with the present invention.

A linear bidirectional full-duplex optocoupler 200 constructed in accordance with the present invention is illustrated in FIG. 5. The device is shown in an eight-pin dual in-line package (DIP) 202. The optocoupler 200 comprises six devices: first and second emitters 220, 222 and first, second, third, and fourth photodetectors 224, 226, 228, 230.

The first emitter 220 is connected across DIP pins 1 and 3; the second emitter 222 is connected across DIP pins 5 and 7; the first photodetector 224 is connected across DIP pins 2 and 3; the second photodetector 226 is connected across DIP pins 3 and 4; the third photodetector 228 is connected across DIP pins 6 and 7; and the fourth photodetector 230 is connected across DIP pins 7 and 8. The optical radiation from the first and second emitters 220, 222 pass through a common optical cavity 232, which may be of any suitable light conducting medium.

In the circuit of FIG. 5, the first emitter 220 and the first and fourth photodetectors 224, 230 are at one wavelength; the second emitter 222 and the second and third photodetectors 226, 228 are at a second wavelength. For example, one of the wavelengths could be 940 nm; the other could be 560 nm.

Figure 6:
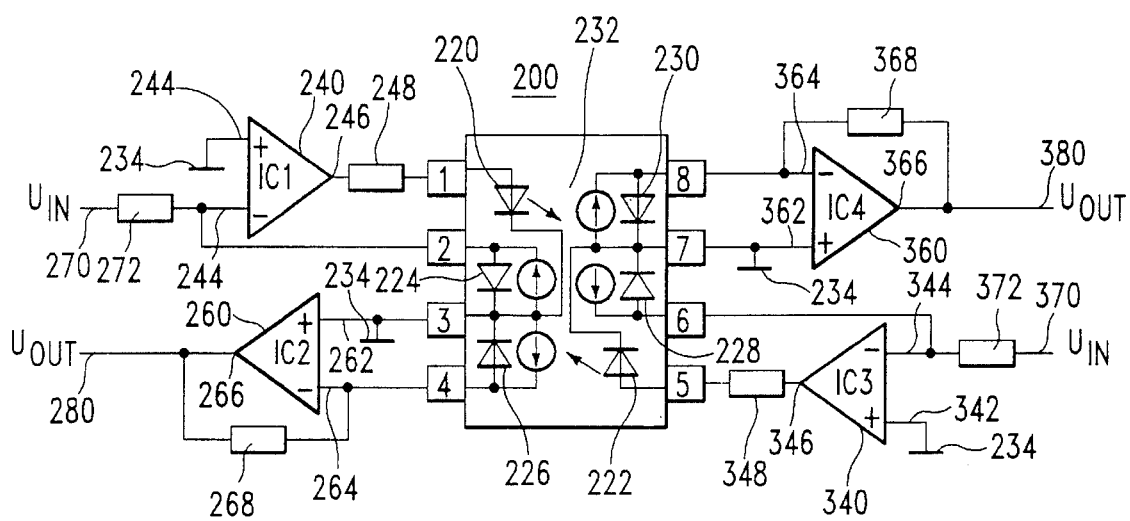
FIG. 6 is a schematic diagram of an application incorporating the linear bidirectional full-duplex optocoupler of FIG. 5.

A circuit incorporating the linear bidirectional full-duplex optocoupler 200 of FIG. 5 is shown in FIG. 6. In this circuit, DIP pins 3 and 7 are connected to ground 234.

A first differential amplifier IC1 240, having a noninverting input 242, an inverting input 244, and an output 246, is connected from its output 246 through a load resistor 248 to DIP pin 1 of the optocoupler 200. The inverting input 244 is also connected to DIP pin 2 of the optocoupler 200. The noninverting input 242 of the first differential amplifier IC1 240 is connected to ground 234. A first signal input 270 is coupled through a coupling resistor 272 to the inverting input 244 of the first differential amplifier 140.

A second differential amplifier IC2 260 has a noninverting input 262, an inverting input 264, and an output 266. The noninverting input 262 of the second differential amplifier 260 is connected to DIP pin 3 of the optocoupler 200 and ground 234; the inverting input 262 is connected to DIP pin 4 of the optocoupler 200. A feedback resistor is connected from the output 266 to the inverting input 264 of the amplifier 260. The first signal output 280 of the optocoupler 200 is taken at the output 266 of the second differential amplifier 260.

A third differential amplifier IC3 340, having a noninverting input 342, an inverting input 344, and an output 346, is connected from its output 346 through a load resistor 348 to DIP pin 5 of the optocoupler 200. The noninverting input 342 of the third differential amplifier IC3 340 is connected to ground 234. A second signal input 370 is coupled through a coupling resistor 372 to the inverting input 344 of the third differential amplifier 140. The inverting input 344 is also connected to DIP pin 6 of the optocoupler 200.

A fourth differential amplifier IC4 360 has a noninverting input 362, an inverting input 364, and an output 366. The noninverting input 362 of the fourth differential amplifier 360 is connected to DIP pin 7 of the optocoupler 200 and ground 234; the inverting input 362 is connected to DIP pin 4 of the optocoupler 200. A feedback resistor is connected from the output 366 to the inverting input 364 of the amplifier 360. The second signal output 380 of the optocoupler 200 is taken at the output 366 of the fourth differential amplifier 360.

Full-duplex communication can also be achieved using conventional frequency division multiplex ("FDM") techniques. Instead of using emitters and photodetectors operating on different wavelengths, all of the devices would operate at the same wavelength. However, the signals would be multiplexed with the optical carriers at different frequencies, using conventional FDM methods. When received, the information would be retrieved in the same fashion as from any FDM carrier-based system.

While there has been described what is believed to be the preferred embodiment of the invention, those skilled in the art will recognize that other and further modifications may be made thereto without departing from the spirit of the invention, and it is intended to claim all such embodiments that fall within the true scope of the invention. For example, it is possible to have more than two emitters and corresponding photodetectors, providing additional channels, using either optical wavelength or frequency division multiplexing.

What is claimed is:

1. An apparatus for simultaneous communication, comprising:

an optical cavity;

first and second means, within the optical cavity, for emitting optical radiation, wherein the first means for emitting generates optical radiation of a first wavelength and the second means for emitting generates optical radiation of a second wavelength; and first and second means, within the optical cavity, for detecting optical radiation, where the first means for detecting is only responsive to optical radiation of the second wavelength and the second means for detecting is only responsive to optical radiation of the first wavelength, the first means for detecting being responsive to optical radiation emitted by the second means for emitting and the second means for detecting being responsive to optical radiation emitted by the first means for emitting.

2. The apparatus as set forth in claim 1, further comprising at least one additional means, within the optical cavity, for emitting optical radiation, wherein the additional means for emitting generates optical radiation of a third wavelength, and at least one additional means, within the optical cavity, for detecting optical radiation, wherein the additional means for detecting is only responsive to optical radiation of the third wavelength, the additional means for detecting being responsive to optical radiation emitted by the additional means for emitting.

3. An apparatus as set forth in claim 1, wherein the communication is bidirectional.

4. A coupler for simultaneous, bidirectional communication, comprising:

an optical cavity;

first and second optical emitters, within the optical cavity, for emitting optical radiation, wherein the first emitter generates optical radiation of a first wavelength and the second emitter generates optical radiation of a second wavelength; and first and second optical detectors, within the optical cavity, for detecting optical radiation, where the first detector is only responsive to optical radiation of the second wavelength and the second detector is only responsive to optical radiation of the first wavelength, the first detector being responsive to optical radiation emitted by the second emitter and the second detector being responsive to optical radiation emitted by the first emitter.

* * * * *